US006537608B2

(12) United States Patent
Miller et al.

(10) Patent No.: US 6,537,608 B2
(45) Date of Patent: Mar. 25, 2003

(54) PROTECTION OF A PLATED THROUGH HOLE FROM CHEMICAL ATTACK

(75) Inventors: Thomas R. Miller, Endwell, NY (US); Kristen A. Stauffer, Vestal, NY (US); Michael Wozniak, Vestal, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/752,915

(22) Filed: Jan. 2, 2001

(65) Prior Publication Data

US 2001/0000884 A1 May 10, 2001

Related U.S. Application Data

(62) Division of application No. 09/345,474, filed on Jun. 30, 1999, now Pat. No. 6,188,027.

(51) Int. Cl.[7] .................................................. B05D 5/12
(52) U.S. Cl. ........................... 427/97; 427/98; 427/307; 427/328
(58) Field of Search ........................... 427/97, 98, 307, 427/327, 328

(56) References Cited

U.S. PATENT DOCUMENTS

| | | |
|---|---|---|
| 4,642,161 A | 2/1987 | Akahoshi et al. |
| 5,035,939 A | 7/1991 | Conlon et al. |
| 5,216,807 A | 6/1993 | Yoshizawa et al. |
| 5,329,158 A | 7/1994 | Lin |
| 5,372,666 A | 12/1994 | Kawasaki |
| 5,441,814 A | 8/1995 | Gunji et al. |
| 5,472,563 A | * 12/1995 | Kogawa et al. .......... 156/629.1 |
| 5,487,218 A | * 1/1996 | Bhatt et al. .................... 29/852 |
| 5,502,893 A | * 4/1996 | Endoh et al. .................. 29/852 |
| 5,557,844 A | 9/1996 | Bhatt et al. |
| 5,626,736 A | 5/1997 | Florio et al. |
| 5,652,042 A | 7/1997 | Kawakita et al. |
| 5,733,467 A | 3/1998 | Kawakita et al. |
| 5,773,132 A | 6/1998 | Blumberg et al. |
| 5,800,859 A | 9/1998 | Price et al. |
| 6,162,503 A | * 12/2000 | Ferrier ........................ 427/327 |

* cited by examiner

Primary Examiner—Brian K. Talbot
(74) Attorney, Agent, or Firm—Schmeiser, Olsen & Watts; Lawrence R. Fraley

(57) ABSTRACT

A method of forming an electronic structure, including adhesively coupling a plated metallic layer (e.g. a copper layer) of a plated through hole (PTH) to holefill material (e.g., epoxy resin) distributed within the PTH. The adhesive coupling utilizes an adhesion promoter film on the plated metallic layer such that the adhesion promoter film is bonded to the resin. The adhesion promoter film may include a metallic oxide layer such as a layer containing cupric oxide and cuprous oxide, which could be formed from bathing a PTH plated with copper in a solution of sodium chlorite. The adhesion promoter film may alternatively include an organometallic layer such as a layer that includes a chemical complex of metal and an organic corrosion inhibitor. The organometallic layer could be formed from bathing the PTH in a bath of hydrogen peroxide, sulfuric acid, and the organic corrosion inhibitor.

17 Claims, 5 Drawing Sheets

PROTECTION OF A PLATED THROUGH HOLE FROM CHEMICAL ATTACK

This application is a divisional of Ser. No. 09/345,474, filed on Jun. 30, 1999 now U.S. Pat. No. 6,188,027.

BACKGROUND OF THE INVENTION

1. Technical Field

The present invention relates to an electronic structure, and associated method of formation, in which a plated metallic layer of a plated through hole (PTH) is adhesively coupled to a resin distributed within the PTH.

2. Related Art

A printed wiring board (PWB), such as a chip carrier, typically includes a substrate with a plated through hole (PTH), wherein the PTH serves to provide electrical coupling between circuitized layers of the PWB. Fabrication of a PWB includes drilling a through hole through a substrate, plating the hole with a metallic substance such as copper to form the PTH, filling the PTH with a volume of nonconductive material (called a "holefill") which adheres to the plated wall of the PTH, forming a first circuit pattern on a first PWB layer and a second circuit pattern on a second PWB layer such that the PTH electrically couples the first circuit pattern to the second circuit pattern. A circuit pattern is typically formed by photolithography, which comprises forming a metallic layer such as a copper layer on a surface of the PWB, forming a photomask layer on the metallic layer, selectively exposing portions of the photomask layer to a suitable wavelength of light (e.g., ultraviolet light) by use of a mask pattern, developing away a portion of the photomask in accordance with the mask pattern, chemically etching portions of the metallic layer not covered by protective photomask material, and removing the remaining photomask material to expose the formed circuit pattern.

The holefill, which includes a resin (or binder) such an epoxy composition, serves several purposes including providing mechanical support for structures on either end, or both ends, of the PTH. If the PWB experiences significant temperature fluctuations during PWB processing or during its operating lifetime, the holefill should be selected to have a coefficient of thermal expansion (CTE) that closely matches the CTE of the substrate material. A material mismatch in CTE would cause differential thermal expansion that could subject high-stress locations near the PTH to fatigue failure from thermal cycling. Inasmuch as holefill epoxy resin typically has a materially higher CTE than that of the substrate, the relatively higher rate of thermal expansion of the holefill may cause the holefill material to act as a piston causing damage to objects mounted on a surface of the PWB near the PTH. To mitigate this adverse effect, the holefill may include a particulate component such as copper powder whose CTE is close to that of the substrate material. In the absence of thermal cycling, the particulate component of the holefill may be unnecessary.

Most importantly, the holefill is intended to protect the PTH metallic plating from the chemical etchant used to form a circuit pattern on a surface of the PWB, as well as from other processing chemicals that could corrosively attack the PTH metallic plating. As to insulation from chemical etchants, this protective feature of the holefill is particularly relevant to the formation of thin (e.g., 1 to 2 mils) circuit lines as opposed to the more conventional thick (e.g., 2 to 4 mil) circuit lines. Forming a thick circuit pattern requires a small amount of etching of the metallic layer on the PWB surface and a consequent small quantity of etchant and as well as a small etchant exposure time. Thus even if the PTH metallic plating were unprotected from the etchant, only a small amount of PTH metallic plating would be etched away, leaving a residual PTH metallic plating that may be sufficiently thick to be electrically effective and mechanically stable during the lifetime of the PWB. In contrast, forming a thin circuit pattern requires relatively large amount of etching of the metallic layer on the PWB surface and a corresponding substantial exposure of an unprotected PTH metallic plating to the etchant, such that the PTH metallic plating may be subject to unacceptable degradation. Thus, it is important that the holefill protect the PTH metallic plating from chemical attack of etchant, or other processing chemical, by reliably maintaining its adhesive contact with the PTH metallic plating.

Unfortunately, the holefill material is generally brittle and is subject to fracture, resulting in some PTH holefill material being pulled out of the PTH during subsequent mechanical or chemical processing. The consequent void volumes within the holefill left by the removed holefill material are referred to a depressions, pits, and chip-outs. A particular cause of the void volumes in the holefill relates to the mask used during the fill operation. If a selective PTH fill is desired, a mask with a pre-drilled pattern is placed on the PWB between the holefill material and the panel of the PWB. During the filling process, this mask undergoes some mechanical coupling to the panel and the filled hole. The mask is removed from the panel after the filling process. The mechanical coupling is very weak but, in some instances, strong enough to cause a fracture of a portion of the holefill material in the PTH that extends below the plane of the panel.

Another cause of void formation in the holefill relates to grinding removal of resin "bleed." The holefill in the PTH may have a protrusion, or a "nub," that extends out of the PTH volume and slightly above the surface of the PWB. During the fill process, when a selective mask is used, some of the resin from the holefill material may migrate, or "bleed," away from the area being filled into the space between the mask and the PWB surface. This effect often occurs because of inherent imperfections in the planarity of the mask and the PWB so that even if the filling is done under vacuum lamination conditions, there may not be a tight seal between the mask and the PWB. The "bleed" can also occur during a non-selective filling. The resulting migrated material, or "resin bleed," is pasted to the surface of the surface of the PWB. The resin bleed material or the protruding "nub" may be removed by grinding with a sanding instrument, which may cause fracture of holefill material in the PTH. Thus, the propensity of holefill material to be fractured is a reliability concern, since the consequent formation of void volumes within the PTH leaves the PTH metallic plating exposed to corrosive attack by chemical etchants and other processing chemicals, as discussed supra.

The PTH metallic plating needs to be protected from chemical attack by chemical etchants and other processing chemicals should PTH holefill material be fractured and pulled away from the PTH metallic plating.

SUMMARY OF THE INVENTION

The present invention provides an electronic structure, comprising a substrate, a plated through hole (PTH) through a thickness of the substrate, an adhesion promoter film on a plated metallic layer of the PTH, and a holefill distributed within an internal volume of the PTH, wherein the holefill includes a resin, and wherein the resin is bonded to the adhesion promoter film.

The present invention provides a method for forming an electronic structure, comprising the steps of
providing a substrate and a plated through hole (PTH) through a thickness of the substrate;
forming an adhesion promoter film on a plated metallic layer of the PTH; and
distributing a holefill within an internal volume of the PTH, said holefill including a resin, and bonding the resin to the adhesion promoter film.

The present invention has the advantage of protecting the PTH metallic plating from chemical attack by chemical etchants and other processing chemicals. The present invention advantageously provides this protection even if the PTH holefill material is severed from the PTH metallic plating.

DETAILED DESCRIPTION OF THE INVENTION

Figure 1:
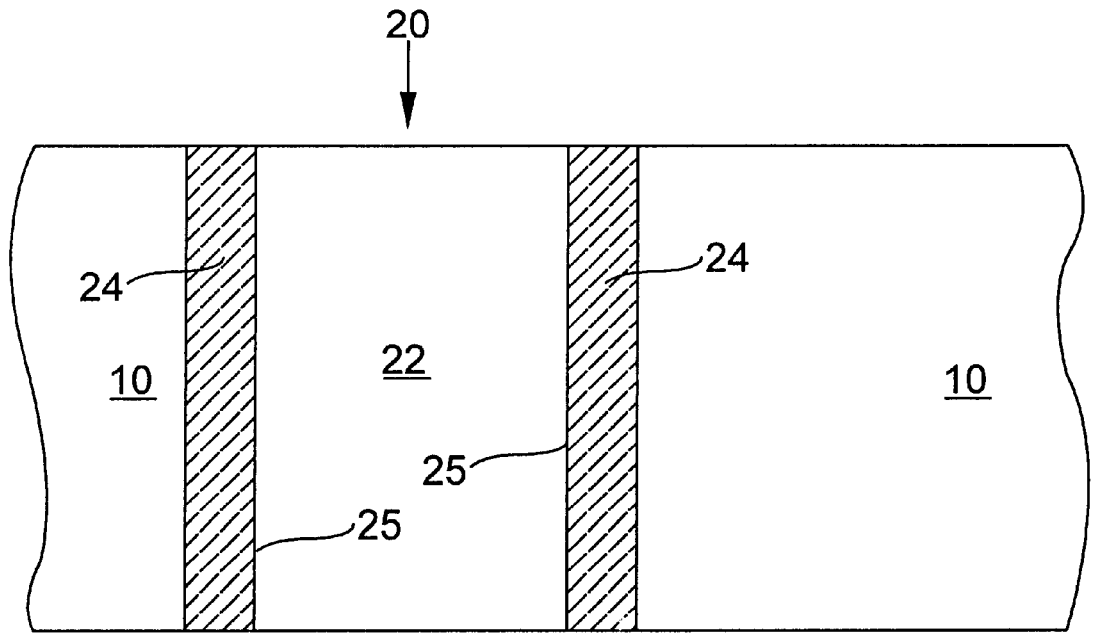
FIG. 1 depicts a front cross-sectional view of a substrate that includes a plated through hole (PTH).
Figure 2:
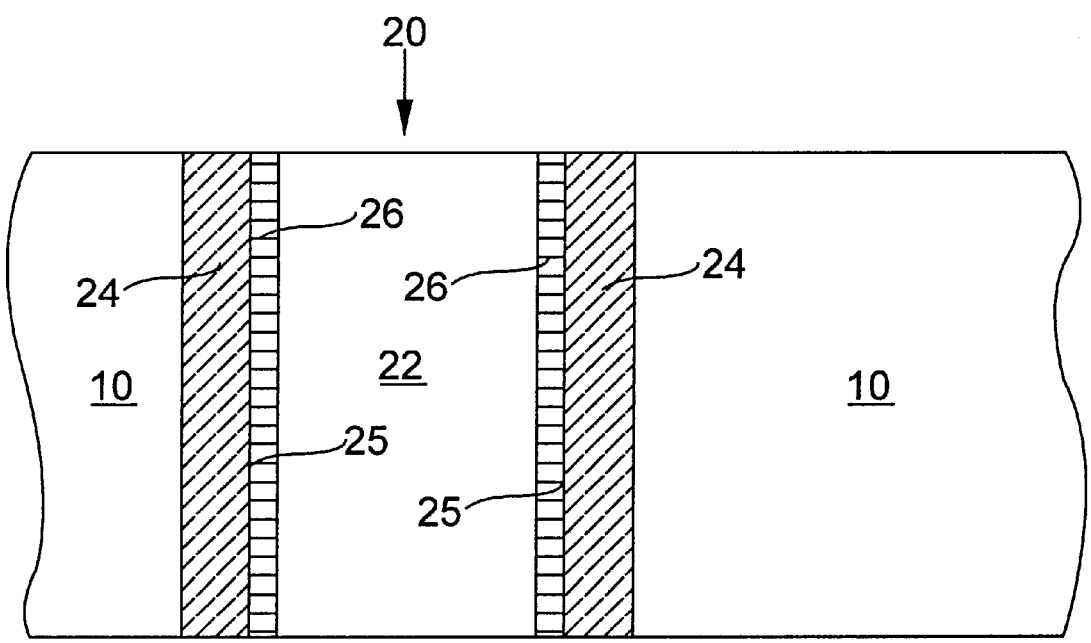
FIG. 2 depicts FIG. 1 after an adhesion promoter film has been formed on the PTH.

FIG. 1 illustrates an initial step in the formation of an electrical structure, in accordance with a preferred embodiment of the present invention. FIG. 1 shows a a substrate 10 having a plated through hole (PTH) 20. The PTH 20 includes a plated metallic layer 24 having a surface 25 that circumscribes an inner void 22. The plated metallic layer 24 may include inter alia a copper layer. FIG. 2 illustrates FIG. 1 after an adhesion promoter film 26 has been formed on the plated metallic layer 24. The adhesion promoter film 26 includes any distribution of material that can effectively bond with a resin material, such as an epoxy resin, that will be inserted into the inner void 22 in a subsequent processing step.

An applicable distribution of material for the adhesion promoter film 26 includes a metallic oxide layer, such as a layer that includes an oxide of copper. A suitable copper oxide layer may be formed by an oxide process using a chlorite bath that may include inter alia sodium chlorite (NaClO$_2$), such as the oxide process of Shipley called "PRO® Bond 80 Oxide with CIRCUPOSIT® Converter" (Shipley, 455 Forest Street, Marlborough, Mass. 10752). The aforementioned Shipley process is based on U.S. Pat. No. 4,642,161 (Akahoshi et al., Feb. 10, 1987), hereby incorporated by reference. Use of the aforementioned Shipley process assumes that the plated metallic layer 24 includes a copper layer. The aforementioned Shipley process oxidizes copper in the plated metallic layer 24 to form the adhesion promoter film 26 which includes one or more oxides of copper. Prior to the oxide process, the plated metallic layer 24 should be chemically cleaned and microetched such as by the following three steps performed in sequence: an alkaline cleaning, a microetch, and an alkaline predip. The alkaline cleaning includes dipping the substrate 10 in a sodium metasilicate solution concentrated between about 45 g/L and about 60 g/L at a temperature between about 62° C. and about 68° C. for a time between about 150 seconds and about 210 seconds. The microetch step etches away copper from the copper layer to form a virgin surface of copper having sawtooth-type rough edges. The microetch step includes dipping the substrate 10 in a solution having an active ingredient of potassium peroxymonosulfate with an active oxygen content of about 1.5 g/L to about 3.5 g/L at a temperature between about 29° C. and about 35° C. for a time between about 110 seconds and about 130 seconds. With the preceding parameters, the copper is etched at a rate of about 30 to 50 microinches/min. Although sodium peroxymonosulfate could substitute for potassium peroxymonosulfate, potassium peroxymonosulfate is preferred because of its greater stability than that of sodium peroxymonosulfate. The alkaline predip step follows the microetch step. Noting that the microetch step uses an acidic bath, the alkaline predip step serves to neutralize any residual acid contacting a surface on or within the substrate 10, including the surface 25 of the plated metallic layer 24. In particular, the alkaline predip step includes dipping the substrate 10 in a sodium hydroxide (NaOH) solution at a concentration in a range of about 0.5 g/100 ml to about 1.5 g/100 ml at ambient temperature for a time between about 110 seconds to about 130 seconds. Following each of the preceding three steps, the substrate 10 may be rinsed in water for a period preferably between about 100 seconds and 260 seconds.

The oxide process of the aforementioned Shipley process generates the adhesion promoter film 26 that includes one or more oxides of copper. In accordance with the following process steps, Shipley's oxide process a thickness of the adhesion promoter film 26 of $\alpha/\rho$, where $\alpha$ is between about 0.35 mg/cm$^2$ and about 0.70 mg/cm$^2$, and $\rho$ is the average density of the adhesion promoter film 26. Shipley's oxide process includes dipping the substrate 10 in a chlorite bath that includes sodium chlorite (NaClO$_2$) and NaOH at a temperature between about 76° C. and about 88° C. for a time between about 110 seconds and about 130 seconds. The NaClO$_2$ should have concentration between about 10 g/100 ml to about 15 g/100 ml. The NaOH should have a concentration between about 3.5 g/100 ml and about 4.3 g/100 ml. The oxide-forming reactions comprise the following two-steps:

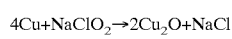

$$4Cu+NaClO_2 \rightarrow 2Cu_2O+NaCl$$

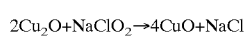

$$2Cu_2O+NaClO_2 \rightarrow 4CuO+NaCl$$

While the preceding reactions in the oxide process indicate an end product of cupric oxide (CuO), the reactions are limited once the adhesion promoter film 26 reaches a certain thickness. Thus, the actual end product is a mixture of cupric oxide (CuO) and cuprous oxide (Cu$_2$O). Following the oxide process, the substrate 10 may be rinsed in water for a period preferably between about 100 seconds and 260 seconds.

In the absence of subsequent acid attack, either CuO or Cu$_2$O are adequate constituents of the adhesion promoter film 26. Nonetheless, for an application in which the substrate 10 serves an inner layer of a multilayered laminate, it desirable to maximally convert the CuO to Cu$_2$O since Cu$_2$O is resistant to acid attack and CuO readily dissolves in acid. For example, subsequent formation of a PTH and/or a circuit layer in a multilayer configuration having the substrate 10 as an inner layer involves metallic plating in an acidic solution which may access the PTH 20 and dissolve the CuO in the adhesion promoter film 26. Thus, the preferred embodiment with the aforementioned Shipley oxide process provides for an optional reducing (or "converter") step that converts CuO to $Cu_2O$. The reducing step includes dipping the substrate 10 in a converter bath that includes dimethylamine borane (DMAB) and NaOH at a temperature between about 15° C. and about 27° C. for a time between about 290 seconds and about 310 seconds. The DMAB, which has the chemical formula $(CH_3)_2NH:BH_3$, should be concentrated at a mass percent between about 0.005% and 0.007%. The NaOH should be concentrated at a mass percent between about 0.003% and about 0.005%. Although the reducing step may be highly beneficial if the substrate 10 is an inner layer of a multilayered laminate, the reducing step may nevertheless be optionally employed if the PTH 20 passes through the total thickness of a laminate. While the reactions in the reducing step are for the purpose of converting CuO to $Cu_2O$, the reactions in the reducing step do not convert all of the CuO. Thus, the actual end product is a mixture of CuO and $Cu_2O$. Following the reducing step, the substrate 10 may be rinsed in water for a period preferably between about 100 seconds and about 260 seconds, followed by drying at a temperature between about 60° C. and about 71° C. period preferably between about 1 minute and about 3 minutes, and finally by baking at a temperature between about 35° C. and about 45° C. for a period between about 45 minutes and about 65 minutes.

Another applicable distribution of material for the adhesion promoter film 26 includes an organometallic layer, such as a layer that includes a chemical complex of a metal (e.g., copper) with an organic corrosion inhibitor. A suitable organometallic layer may be formed by an oxide replacement process in which the metallic layer reacts with hydrogen peroxide and an organic corrosion inhibitor to form the aforementioned chemical complex. Prior to the oxide replacement process, the plated metallic layer 24 should be chemically cleaned and microetched such as by the following three steps performed in sequence: a microetch, an alkaline cleaning, and an acidic predip. The microetch and alkaline cleaning steps preceding the oxide replacement process are the same as the microetch and alkaline cleaning steps, respectively, preceding the oxide process, discussed supra. The acidic predip step preceding the oxide replacement process uses a dilute solution of hydrogen peroxide. In contrast, the alkaline predip step of the oxide process uses a dilute solution of sodium hydroxide, as discussed supra.

An effective oxide replacement process is grounded in the process described in U.S. Pat. No. 5,800,859 (Price et al., Sep. 1, 1998), hereby incorporated by reference, for treating a metal surface to promote adhesion thereto. using the plated metallic layer 24 as a source of copper, this effective oxide replacement process is based on the following chemical reaction of copper in the plated metallic layer 24 with sulfuric acid ($H_2SO_4$), hydrogen peroxide ($H_2O_2$), and an organic corrosion inhibitor (nA, where A is an organic compound and n is a positive integer):

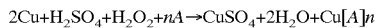

$$2Cu+H_2SO_4+H_2O_2+nA \rightarrow CuSO_4+2H_2O+Cu[A]n$$

U.S. Pat. No. 5,800,859 should be consulted for the implementation details. The organic corrosion inhibitor (nA) may include inter alia a triazole, a tetrazole, or an imidazole. The adhesion promoter film 26 shown in FIG. 2 includes the chemical complex Cu[A]n formed by the preceding oxide replacement process.

Figure 3:
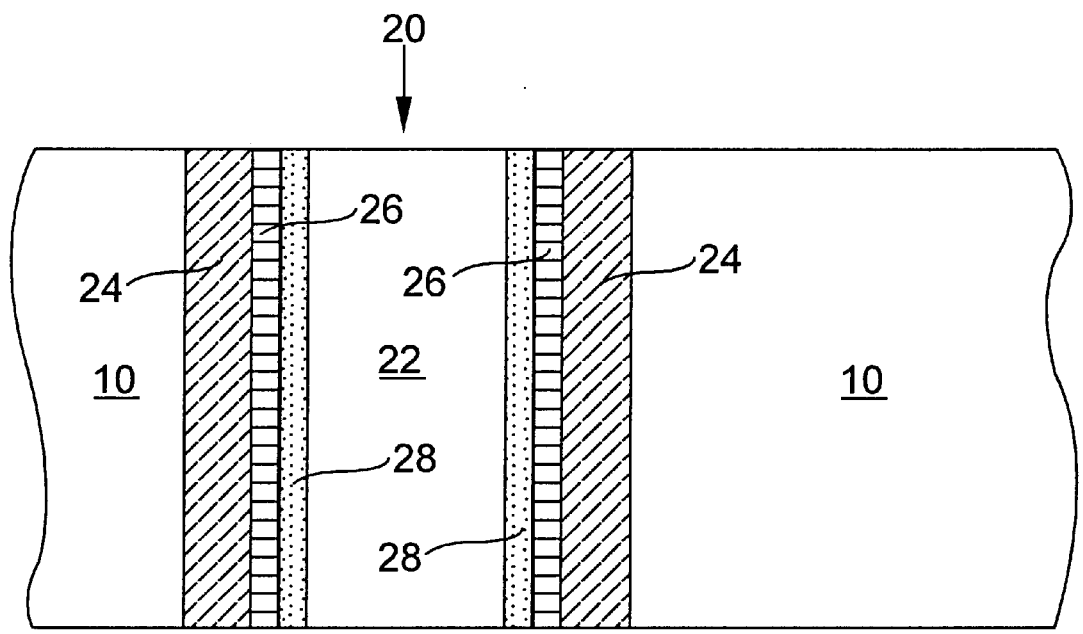
FIG. 3 depicts FIG. 2 after an adhesion promoter layer has been formed on the adhesion promoter film.

Thus, an oxide process or an oxide replacement process may be used inter alia for forming the adhesion promoter film 26 shown in FIG. 2. An alternative implementation illustrated in FIG. 3 includes forming an adhesion promoter layer 28 on the adhesion promoter film 26 by the oxide replacement process described supra, wherein the adhesion promoter film 26 includes a metallic oxide layer and adhesion promoter layer 28 includes an organometallic layer. It has been found by test that the combination of the adhesion promoter layer 28 and the adhesion promoter film 26 of FIG. 3 is about twice as effective in promoting adhesion with an epoxy resin as is an adhesion promoter film having a single metallic oxide layer.

Figure 4:
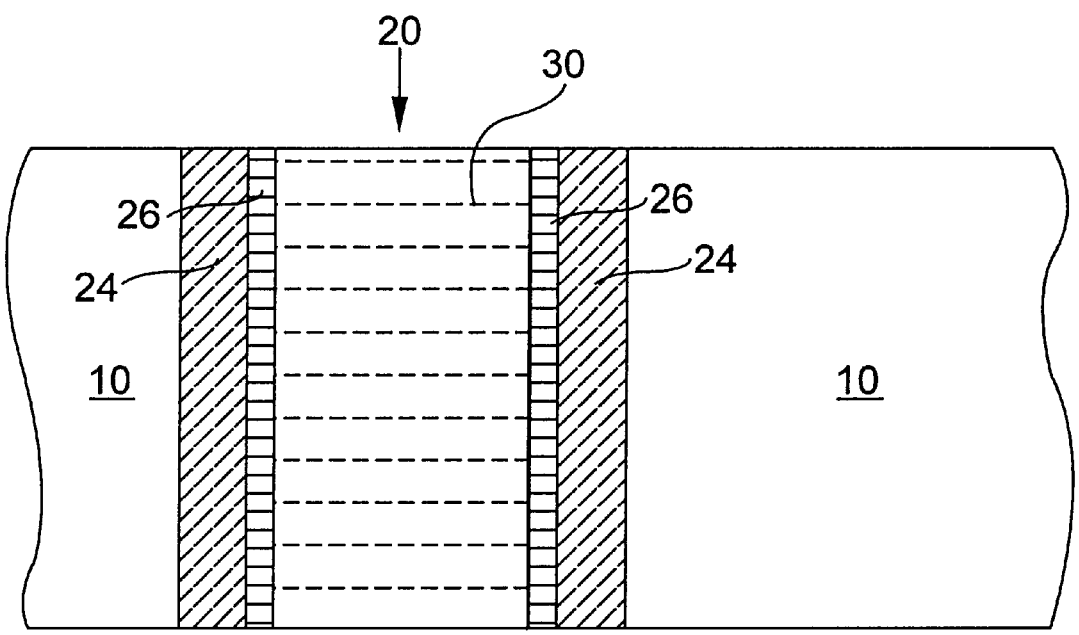
FIG. 4 depicts FIG. 2 after the PTH has been filled with holefill material.
Figure 5:
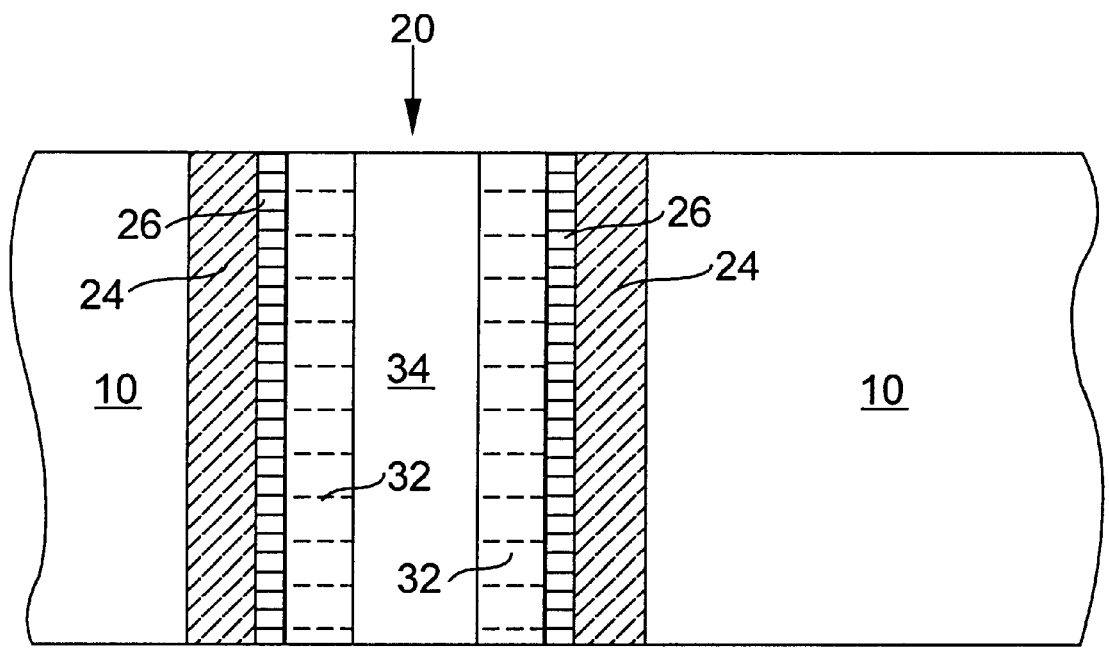
FIG. 5 depicts FIG. 2 after the PTH has been partially filled with holefill material.

FIG. 4 illustrates FIG. 2 after the inner void 22 of the PTH 20 has been filled with a holefill material 30 that includes a resin such as an epoxy composition or a cyanite composition. The holefill may also include a particulate component as discussed supra in the Related Arts section. The particulate component may include inter alia a metal powder such as a copper powder. The particulate component may include any of the materials stated in col. 4, lines 22–35 of U.S. Pat. No. 5,487,218 (Bhatt et al., Jan. 30, 1996), hereby incorporated by reference. The holefill material 30 may fill the entire volume of the inner void 22, as shown in FIG. 4. An alternative configuration of FIG. 5 shows FIG. 2 after the inner void 22 of the PTH 20 has been partially filled with a holefill material 32, leaving a remaining inner void 34.

Figure 6:
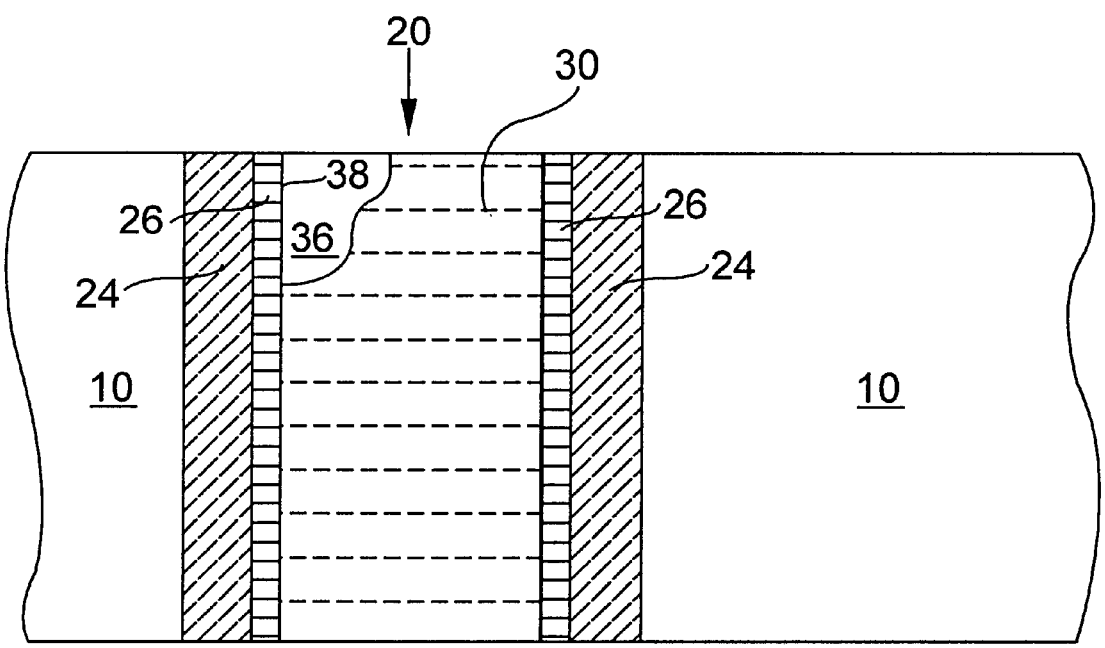
FIG. 6 depicts FIG. 4 after some holefill material has been removed.

A very important property of the adhesion promoter film 26 is its ability to protect the plated metallic layer 24 by resisting corrosive chemical attack and creating an impervious protective barrier. Thus, even if the bulk of the holefill material should fracture and separate from the adhesion promoter film 26, the adhesion promoter film 26 is nevertheless able to protect the metallic layer 24 from corrosive chemical attack. FIG. 6 illustrates FIG. 4 after some holefill material has fractured and separated, leaving a void 36 that exposes a surface 38 of the adhesion promoter film 26. Nonetheless, an exposed portion of the adhesion promoter film 26 (in the vicinity of the exposed surface 38) is able to effectively protect the metallic layer 24 from corrosive chemical attack.

Figure 7:
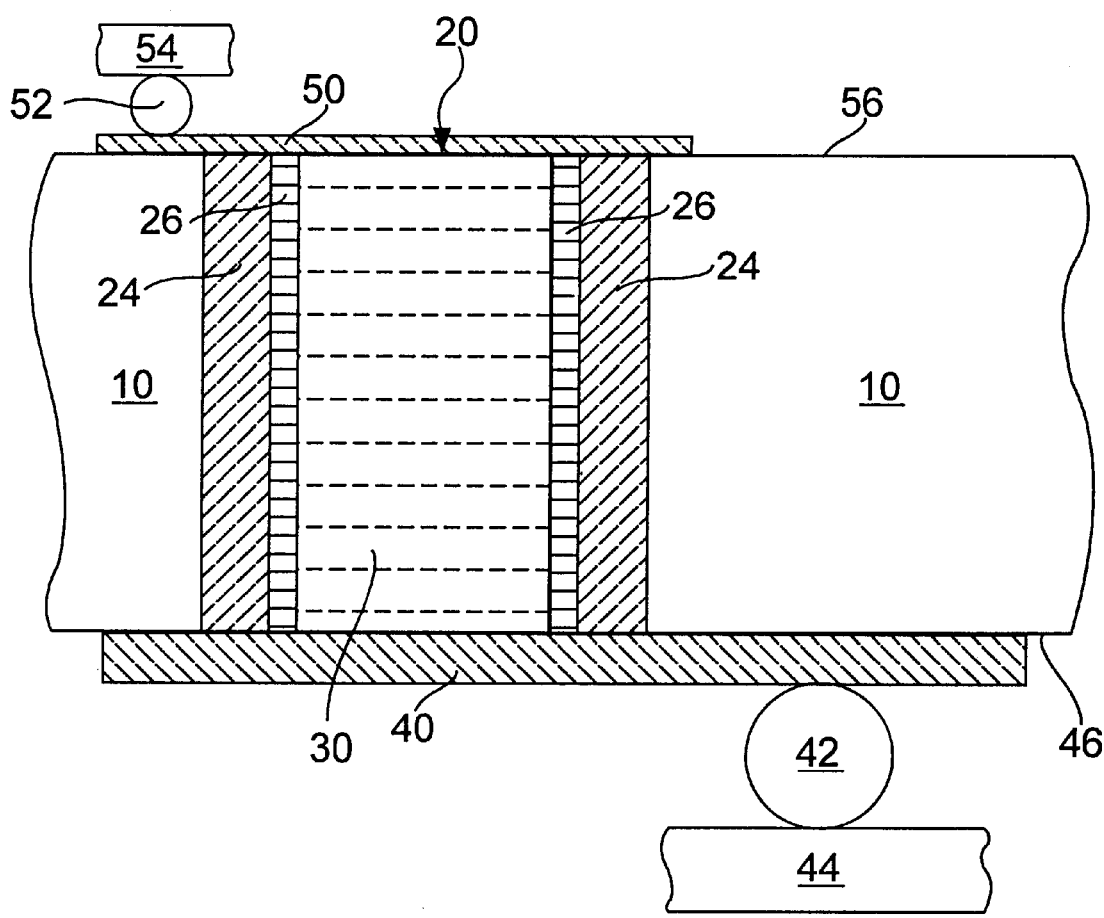
FIG. 7 depicts FIG. 4 after circuit patterns and electronic devices have been added.

FIG. 7 illustrates FIG. 4 after circuit patterns and electronic devices have been added. In FIG. 7, a circuit pattern 50 on a surface 56 of the substrate 10 is electrically coupled by the plated metallic layer 24 of the PTH 20 to a circuit pattern 40 on a surface 46 of the substrate 10. An electronic assembly 54, such as a chip, is electrically coupled to the circuit pattern 50 by a solder ball 52 such as a controlled collapse chip connection (C4) solder ball. An electronic carrier 44, such as a circuit card, is electrically coupled to the circuit pattern 40 by a solder ball 42 such as a ball grid array (BGA) solder ball.

Figure 8:
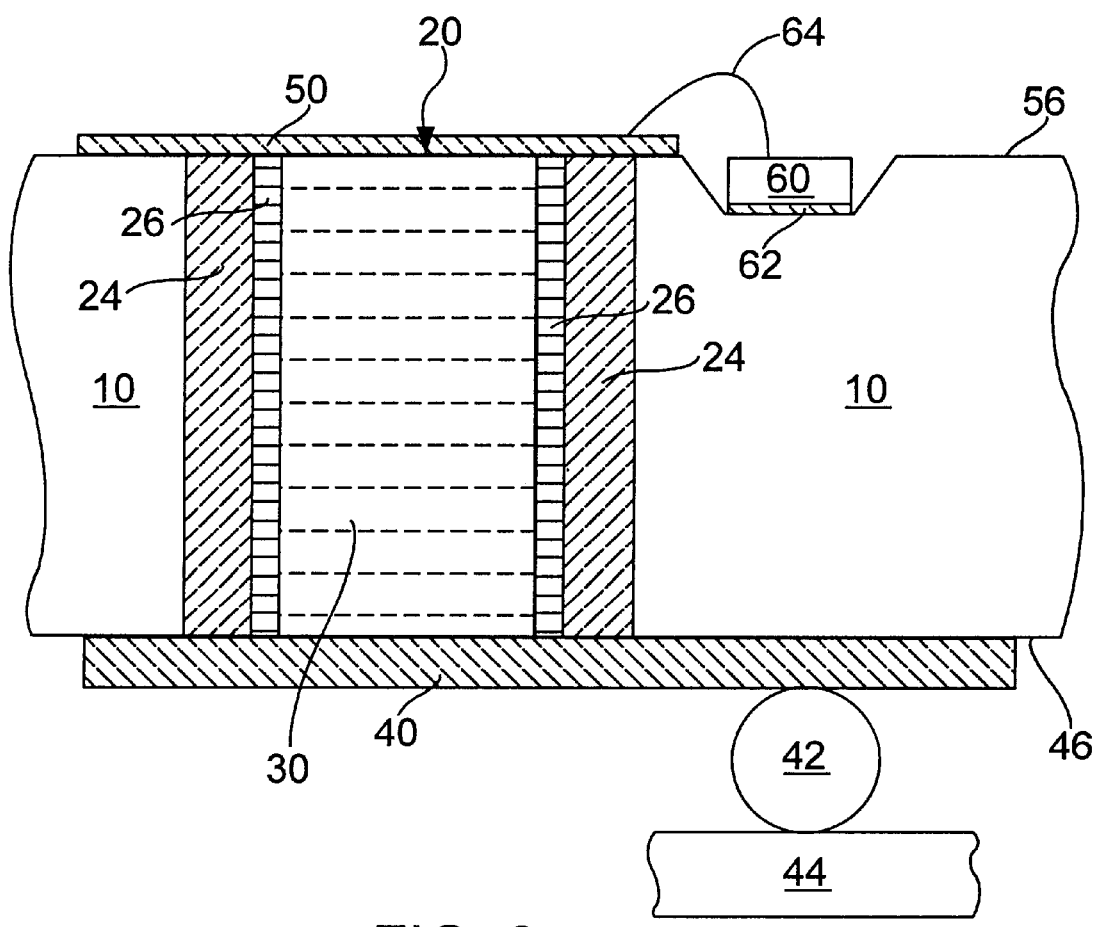
FIG. 8 depicts FIG. 7 with an electronic device removed and an electronic device added.

FIG. 8 illustrates FIG. 7 with the electronic assembly 54 and the solder ball 52 removed. FIG. 8 additionally shows an electronic assembly 60 (e.g. a chip) within the substrate 10 beneath the surface 56 and bonded to the substrate 10 by an adhesive interface 62. The electronic assembly 60 is electrically coupled to the circuit pattern 50 by a wirebond interconnect 64 such as a gold wire.

While preferred and particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

We claim:

1. A method for forming an electronic structure, comprising the steps of
providing a substrate and a plated through hole (PTH) through a thickness of the substrate;
forming an adhesion promoter film on a plated metallic layer of the PTH, wherein the plated metallic layer includes copper, wherein forming the adhesion promoter film includes
chemically cleaning and microetching the plated metallic layer and dipping the substrate in a chlorite bath and dipping the substrate in a reducing solution; and
distributing a holefill within the PTH, said holefill including a resin, and bonding the holefill to the adhesion promoter film such that the hole fill mechanically attaches directly of the adhesion promoter film.

2. The method of claim 1, wherein the chlorite bath includes sodium chlorite.

3. The method of claim 1, wherein the reducing solution includes dimethylamine borane.

4. The method of claim 1, wherein the distributing step partially but not completely fills the PTH with said holefill.

5. A method for forming an electronic structure, comprising the steps of
providing a substrate and a plated through hole (PTH) through a thickness of the substrate;
forming an adhesion promoter film on a plated metallic layer of the PTH, wherein forming the adhesion promoter film includes forming a metallic oxide layer on the plated metallic layer and forming an organometallic layer on the metallic oxide layer; and
distributing a holefill within the PTH, said holefill including a resin, and bonding the holefill to the adhesion promoter film.

6. The method of claim 1, wherein the resin includes a composition selected from the group consisting of an epoxy composition, a cyanate composition, and a combination thereof.

7. The method of claim 1, wherein the holefill further includes a particulate composition.

8. The method of claim 1, wherein the resin includes a composition selected from the group consisting of an epoxy composition, a cyanate composition, and a combination thereof.

9. The method of claim 1, wherein the adhesion promoter film includes a mixture of cuprous oxide and cupric oxide.

10. The method of claim 1, wherein the chemically cleaning comprises dipping the substrate in a sodium metasilicate solution.

11. The method of claim 1, wherein the microetching comprises dipping the substrate in a solution having an active ingredient of potassium peroxymonosulfate or sodium peroxymonosulfate.

12. The method of claim 1, wherein the resin includes a composition selected from the group consisting of an epoxy composition, a cyanate composition, and a combination thereof.

13. The method of claim 1, wherein the organometallic layer includes a chemical complex of a metal and an organic corrosion inhibitor.

14. The method of claim 13, wherein the organic corrosion inhibitor is selected from the group consisting of a triazole, a tetrazole, and an imidazole.

15. The method of claim 1, wherein forming the organometallic layer comprises reacting the metallic layer with hydrogen peroxide and an organic corrosion inhibitor.

16. The method of claim 5, wherein the resin includes a composition selected from the group consisting of an epoxy composition, a cyanate composition, and a combination thereof.

17. The method of claim 5, wherein the distributing step partially but not completely fills the PTH with said holefill.

* * * * *